United States Patent
Moens et al.

(10) Patent No.: US 8,115,273 B2
(45) Date of Patent: Feb. 14, 2012

(54) DEEP TRENCH ISOLATION STRUCTURES IN INTEGRATED SEMICONDUCTOR DEVICES

(75) Inventors: Peter Moens, Zottegem (BE); Filip Bauwens, Loppem (BE); Joris Baele, Ghent (BE)

(73) Assignee: Semiconductor Components Industries, LLC, Phoenix, AZ (US)

( * ) Notice: Subject to any disclaimer, the term of this patent is extended or adjusted under 35 U.S.C. 154(b) by 677 days.

(21) Appl. No.: 12/163,909

(22) Filed: Jun. 27, 2008

(65) Prior Publication Data

US 2009/0039460 A1 Feb. 12, 2009

(30) Foreign Application Priority Data

Jun. 29, 2007 (EP) .................................... 07012746

(51) Int. Cl.
*H01L 29/00* (2006.01)
(52) U.S. Cl. .................. 257/519; 257/510; 257/520
(58) Field of Classification Search .................. 257/520, 257/510, 519
See application file for complete search history.

(56) References Cited

U.S. PATENT DOCUMENTS

| | | | | |
|---|---|---|---|---|
| 6,064,106 A | * | 5/2000 | Shishido et al. | 257/513 |
| 6,734,524 B1 | * | 5/2004 | Parthasarathy et al. | 257/510 |
| 2007/0170543 A1 | * | 7/2007 | Furukawa et al. | 257/520 |

FOREIGN PATENT DOCUMENTS

EP 0146789 A2 7/1985

OTHER PUBLICATIONS

C.M. Tan, Y.F. Wong, P.H. Teoh and G.Y. Huang; "Improving the Reverse Blocking Capability of Carrier Stored Trench-Gate Bipolar Transistor", 2003 IEEE; pp. 89-92.
F. De Pestel, P. Moens, H. Hakim, H. De Vleeschouwer, K. Reynders, T. Colpaert, P. Colson, P. Coppens, S. Boonen, D. Boblognesi, M. Tack; "Development of a Robust 50V 0.35 um Based Smart Power Technology Using Trench Isolation", 2003 IEEE; pp. 182-185.
F. De Pestel, P. Coppens, H. De Vleeschouwer, P. Colson, S. Boonen, T. Colpaert, P. Moens, D. Boblognesi, G. Coudenys, M. Tack; "Deep Trench Isolation for a 50V 0.35 um Based Smart Power Technology", 2003 IEEE; pp. 191-194.

* cited by examiner

*Primary Examiner* — Marcos D. Pizarro
*Assistant Examiner* — Tifney Skyles
(74) *Attorney, Agent, or Firm* — Kevin B. Jackson

(57) ABSTRACT

A integrated semiconductor device has a first semiconductor layer of a first conductivity type, a second semiconductor layer of the first conductivity type over the first layer, a third semiconductor layer of a second conductivity type over the second layer, an isolation trench extending through the entire depth of the second and third layers into the first layer, and a first region of the second conductivity type located next to the isolation trench and extending from an interface between the second and third layers, along an interface between the second layer and the isolation trench. This first region can help reduce a concentration of field lines where the isolation trench meets the interface of the second and third layers, and hence provide a better reverse breakdown characteristic.

22 Claims, 6 Drawing Sheets

DEEP TRENCH ISOLATION STRUCTURES IN INTEGRATED SEMICONDUCTOR DEVICES

CROSS-REFERENCE TO RELATED APPLICATIONS

This patent application claims the benefit of European Patent Application Serial No. 07012746.9, filed Jun. 29, 2007, which patent application is incorporated herein by reference in its entirety.

BACKGROUND

1. The Field of the Invention

This invention relates to integrated semiconductor devices having isolation trenches, and to corresponding methods of manufacture.

2. Description of the Related Art

Background: Junction Isolated smart power technologies have the drawback of large lateral isolation structures, the area consumed by such structures being dependent on the required blocking voltage (the higher the voltage requirement, the more area needed). Vertical isolation is typically achieved by using highly doped implanted buried layers, requiring large thermal budgets.

Technologies processed on SOI use trench isolation, guaranteeing both lateral and vertical isolation through oxide layers. However, SOI is still expensive. Moreover, it has some inherent drawbacks for power switching and high voltage applications: (1) in order to reduce the effect of the back-gate effect (substrate potential), the buried oxide needs to be thick, (2) a thick oxide poses a barrier to the heat generated in a power switch due to the much lower thermal diffusivity in oxide compared to silicon. Hence, the devices will be much more prone to thermal destruction upon power switching, and have to be designed accordingly.

U.S. Pat. No. 4,140,558: B. T. Murphy et al., Isolation of Integrated Circuits Utilizing Selective Etching and Diffusion, Feb. 20, 1979 shows an early example of isolation.

U.S. Pat. No. 5,914,523: R. Bashir et al., "Semiconductor Device Trench Isolation Structure with Polysilicon Bias Contact", Jun. 22, 1999 shows a trench isolation structure which includes a field oxide (FOX) layer on the surface of the semiconductor substrate and an isolation trench which extends vertically through the FOX layer and into the semiconductor substrate. Because of this structural arrangement of the isolation trench, the isolation trench has both semiconductor substrate sidewalls and FOX sidewalls.

U.S. Pat. No. 6,362,064: J. M. McGregor et al., "Elimination of Walk-Out in High Voltage Trench Isolated Devices", Mar. 26, 2002 shows another example of trench isolation.

V. Parthasarathy et al., "A Multi-Trench Analog+Logic Protection (M-Trap) for Substrate Cross-talk Prevention in a 0.25 µm Smart Power Platform with 100V High-Side Capability", ISPSD, pp 427-430 (2004) shows an example having multiple trenches.

FIG. 1 shows deep trench isolation as is currently used in the I3T50 technology of Amis (see F. De Pestel et al., "Development of a Robust 50V 0.35 µm Based Smart Power Technology Using Trench Isolation", ISPSD 2003, pp 182-185.). On top of a p-substrate (103), a highly doped buried layer (102) of opposite doping (hence n-type) is created by ion implantation and subsequent thermal annealing. By using a blanket i.e. non-masked approach, a sheet resistance of ~12-15 Ω/square can be achieved. A lower sheet resistance would require too high implantation doses, resulting in excessive defect formation. A low resistive buried layer is advantageous as it can serve as the drain terminal of quasi-vertical devices (hence low drain resistance), and because it also serves as the base of the (vertical) substrate PNP. A highly doped base yields an inefficient bipolar device, thus reducing the injection of carriers in the substrate. On top of the buried layer (102) a lowly doped epitaxial layer (101) of the same conductivity type as the buried layer is grown. All active devices will be made in the lowly doped epitaxial layer. In order to connect the buried layer (102) at the top silicon, a self-aligned sinker (104) of the same conductivity type as the buried layer (102) is made. Two epitaxial pockets are isolated from each other by a deep trench structure (110). After being etched, a thick isolation layer (106) is grown or deposited on the trench sidewall. This can be oxide, nitride, or a combination of both. The remaining trench is filled with a filling material (107) like polysilicon or oxide. Both epitaxial pockets are connected by metal contacts (108) and (109). If necessary, also the trench polyilicon (107) can be separately contacted and biased. In order to kill the parasitic MOS transistor (contact (108) serving e.g. as source, contact (109) serving as drain, filling layer (107) as gate electrode if conducting, insulator (106) as gate dielectric and (103) as substrate terminal), a p-stop implant (105) is implanted at the trench bottom after trench etch.

A similar structure is proposed in U.S. Pat. No. 4,140,558 (Feb. 20, 1979). However, the authors focus on [110] Si material with trenches along the <111> crystal orientations in order to be able to make narrow trenches. U.S. Pat. No. 5,943,578 and U.S. Pat. No. 667,226B2 also show similar structures.

FIG. 2 shows another known arrangement, as shown in U.S. Pat. No. 6,734,524. A deep trench is etched in a silicon layer stack comprising of a substrate (203) of a given conductivity type, a layer (204) of the same conductivity type but with a lower doping than (203), a layer (202) of the opposite conductivity type and finally a layer (201) of either conductivity type. The trench has an insulating layer (205) and is filled with a conductive material (206) for stress relief. The advantage of this structure is that it yields a good isolation from the substrate due to the low diffusion length of electrons (minority carriers) in the substrate.

BRIEF SUMMARY OF THE INVENTION

An object of embodiments of the invention is to provide improved integrated semiconductor devices having isolation trenches, and to corresponding methods of manufacture.

According to a first aspect, the invention provides:

An integrated semiconductor device having a first semiconductor layer of a first conductivity type, a second semiconductor layer of the first conductivity type over the first layer, a third semiconductor layer of a second conductivity type over the second layer, an isolation trench extending through the entire depth of the second and third layers into the first layer, and a first region of the second conductivity type located next to the isolation trench and extending from an interface between the second and third layers, along an interface between the second layer and the isolation trench.

According to another aspect, the invention provides:

An integrated semiconductor device having a first semiconductor layer of a first conductivity type, a second semiconductor layer of the first conductivity type over the first layer and having a lower doping level than that of the first layer, a third semiconductor layer of a second conductivity type over the second layer, an isolation trench extending through the entire depth of the second and third layers into the first layer, and a first region of the second conductivity type located next to the isolation trench and extending from an interface between the second and third layers, along an interface between the second layer and the isolation trench.

This first region can help provide an improved reverse breakdown characteristic for the device. In particular, it can help reduce a concentration of field lines as shown in FIGS. 4a and 4b, where the isolation trench meets the interface of the second and third layers, and hence provide a better reverse breakdown characteristic. This in turn can reduce or avoid the need for a thicker isolation trench to achieve the same purpose. Thus the surface area needed can be reduced, or characteristics improved for a given surface area.

Other aspects of the invention include methods of manufacture of such devices.

Another aspect provides an integrated semiconductor device having a first semiconductor layer of a first conductivity type, a second semiconductor layer of the first conductivity type over the first layer, a third semiconductor layer of a second conductivity type over the second layer, an isolation trench extending through the entire depth of the second and third layers into the first layer, and having a fourth semiconductor layer of either conductivity type, over the third semiconductor layer, and having one or more active devices in the fourth layer, the isolation trench extending through the fourth layer.

Any features may be added within the scope of the claims, and some such additional features are described and claimed explicitly. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

BRIEF DESCRIPTION OF THE DRAWINGS

How the present invention may be put into effect will now be described by way of example with reference to the appended drawings, in which.

DETAILED DESCRIPTION OF THE PREFERRED EMBODIMENTS

Figure 1:
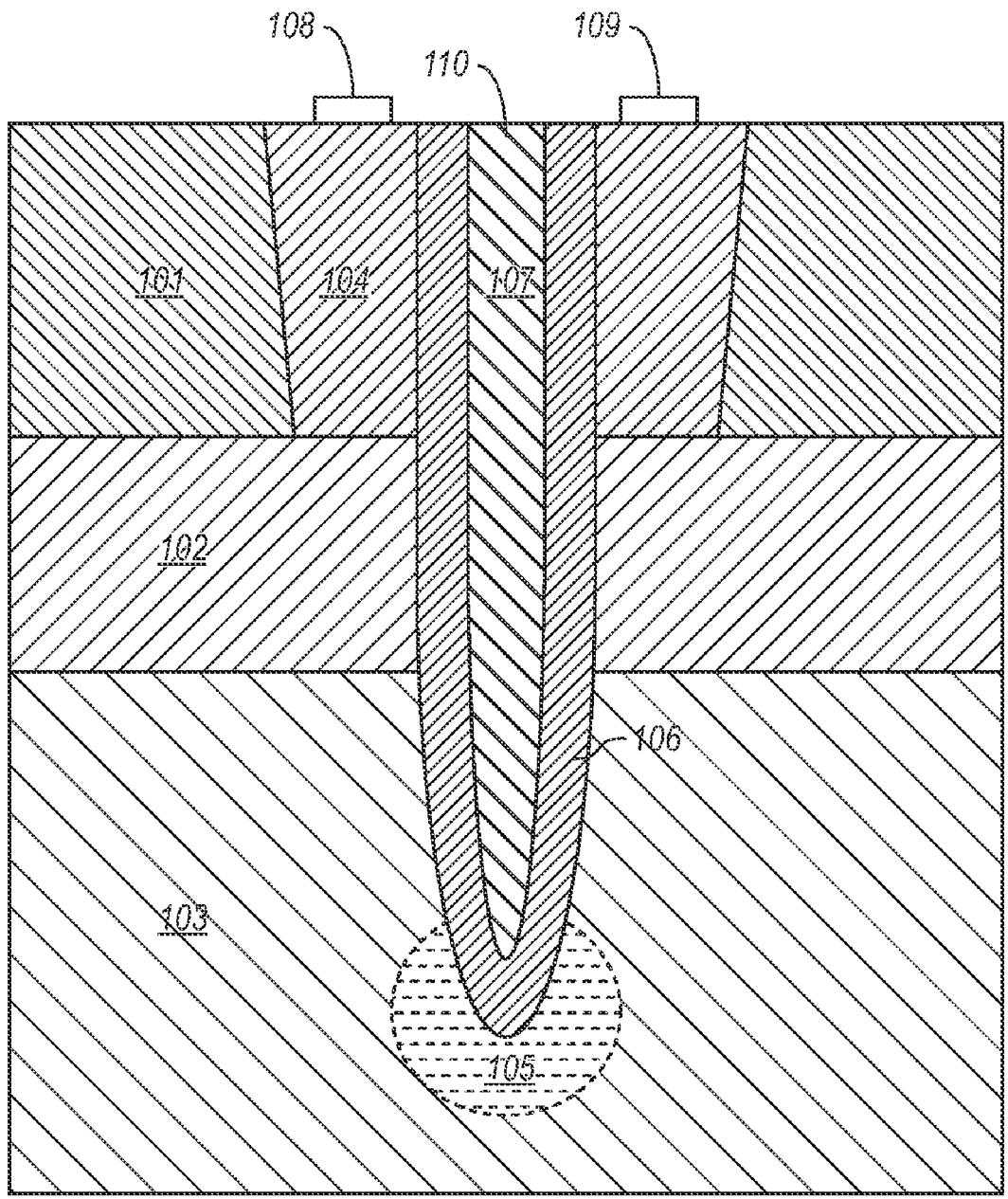
FIGS. 1 and 2 show cross section views of known structures.
Figure 2:
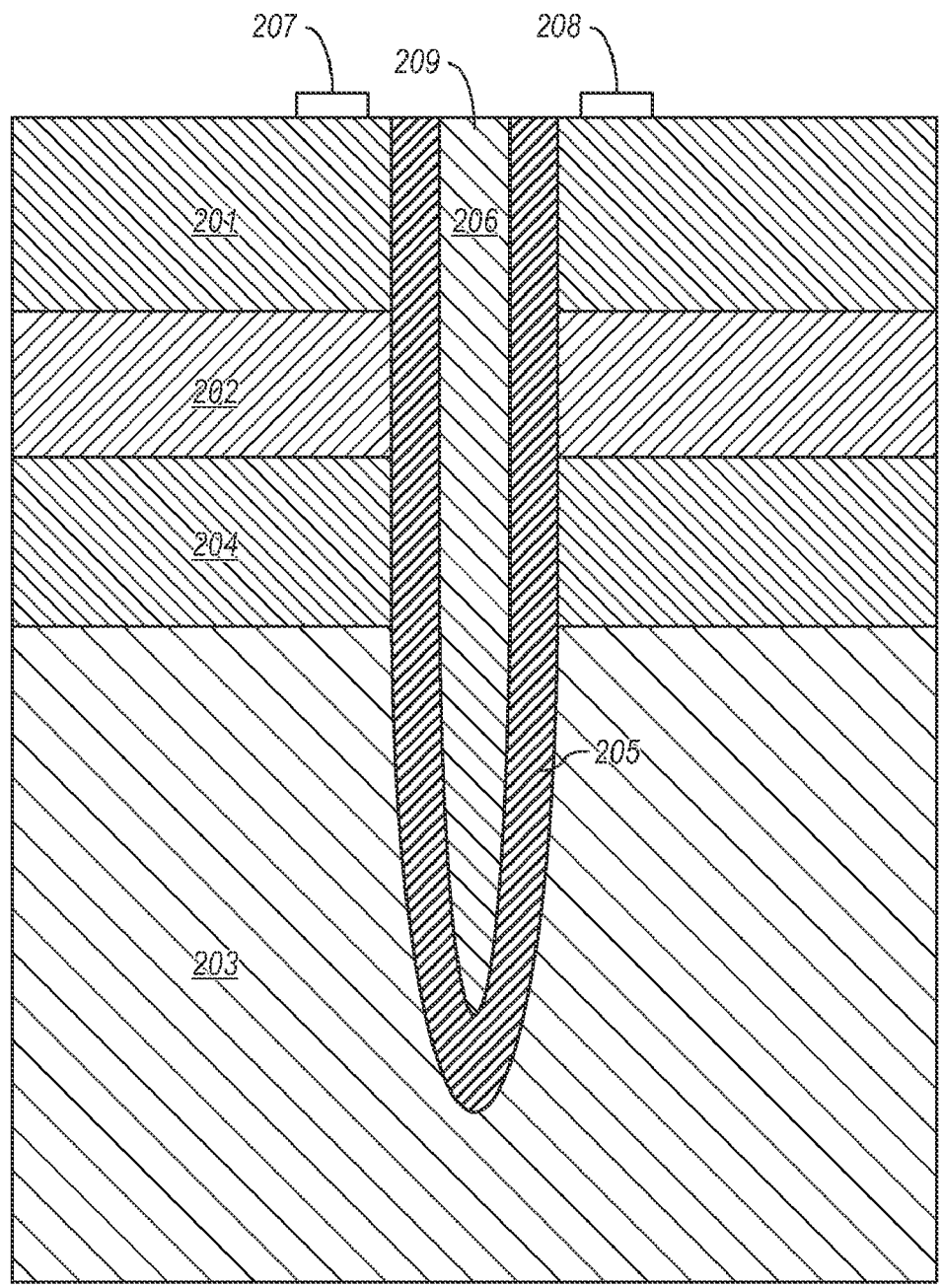

Embodiments of the present invention will be described with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

The term "comprising", used in the claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

Furthermore, the terms first, second, third and the like in the description and in the claims, are used for distinguishing between similar elements and not necessarily for describing a sequential or chronological order. It is to be understood that the terms used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

The embodiments described show examples of how to make isolation structures that account for both lateral isolation (component-to-component) as well as vertical isolation (component-to-substrate). The structures should be area-efficient and be able to compete with SOI with respect to the substrate isolation at high temperature. Moreover, the breakdown of the structures should be sufficiently high. Unlike SOI, the embodiments using the proposed solution can be cost-competitive and need no buried oxide, thus enabling avoiding improving the power dissipation and temperature rise due to power pulsing. At least some of the embodiments can combine the area-efficiency of trench isolation with the thermal advantageous properties of silicon compared to oxide. According to some embodiments of the present invention, the vertical isolation is guaranteed by using a p++/p−/n++/n− type arrangement for the stack of layers. In some embodiments, the reverse breakdown is improved by a novel approach.

The known arrangements discussed above have several important shortcomings. If the transistors need to be floating towards the substrate (i.e. in the usual case where the substrate is p-type, the n-pockets can be at any given positive potential with respect to the substrate, until the reverse breakdown of the n-pockets/p-substrate diode goes into avalanche), the substrate concentration needs to be low. Hence in U.S. Pat. No. 4,140,558 there is a problem of latch-up between two adjacent pockets. This problem is solved in U.S. Pat. No. 6,734,524. However, the reverse breakdown of such a trench isolation structure is determined by the bending of the potential lines in the liner oxide (205) near the junction between layers (202) and (204). A way to solve the crowding of the potential lines is by increasing the liner oxide (205) thickness. This is however not desirable because it will increase the trench width and hence the silicon area the structure consumes. Compared to known arrangements, at least some of the embodiments of the present invention are notable for any one or more of the following:

1. They can provide a solution to the early trench breakdown without having to increase the liner oxide thickness.
2. They can enable a contact with the highly doped buried layer in a straightforward and area-efficient manner.
3. They can provide a way to create a very low-resistive buried layer, without extra process cost. Sheet resistances down to 2 Ω/square have been proven on silicon. For quasi-vertical devices, the buried layer sheet resistance is very important as it is part of the total drain resistance.

Some of the notable additional features of embodiments of the invention are as follows.

The integrated semiconductor structure can have a first semiconductor layer, e.g. silicon layer of the first conductivity type, a second semiconductor layer, e.g. silicon layer of the same conductivity type and lower doping concentration, a third semiconductor layer, e.g. silicon layer of the second conductivity type and high doping concentration, and a fourth layer of either conductivity type and lower doping concentration. The first layer preferably has a high doping concentration, but this is not mandatory. The second and fourth layers have a lower doping concentration. A deep trench is present and extends from the silicon surface into the first silicon layer. A highly doped connection is made between the third layer and the semiconductor, e.g. silicon surface, being of the same conductivity type as the third layer, and made self-aligned to the trench. This extension can be made by diffusion from a solid state source, or by ion implantation. A lowly doped extension along the trench sidewall and in the second layer is made, being of the same conductivity type as the third layer, and also made self-aligned to the trench. This enables an increase in the reverse blocking voltage of the structure. The lowly doped extension can be made by diffusion from a solid state source, or by ion implantation.

One way to make a very lowly doped buried layer (to implement the third semiconductor, e.g. silicon layer) is by means of an epitaxial process. In this way, no ion implantation nor thermal annealing is necessary. In addition, the sheet resistance of the third semiconductor, e.g. silicon layer can be decreased below 4 Ω/square, a value which is not achievable by conventional methods.

One way to make the complete stack of silicon layers is to use a single epitaxial process step. Although the example described uses silicon layers, the layers can be made from other semiconductor materials or combinations of materials to achieve similar functions.

The making of layer (304a) can be by either ion implantation or diffusion from a solid source for example.

The making of layer (304b) can be by either ion implantation or by diffusion from solid source (313) for example, where the first trench (312) is suitably deep etched so that the diffused profile (304a) extends into layer (305) thus forming layer (304b).

Another embodiment has a structure where the first semiconductor, e.g. silicon layer has the same doping as the second semiconductor, e.g. silicon layer. If the =doping is high, the reverse breakdown voltage will be determined by the planar junction breakdown between layers (302) and (305) and will be low. If the doping is low, a stopper implant (105) is to be processed at the bottom of the trench prior to the formation of the insulating layer (306) to prevent MOS turn-on.

Another embodiment has a structure where layer (304b) is not extending through layer (302).

From a top view, when a trench turns a corner at or away from a junction where two trenches merge, the structures can be made with straight corners or with cut corners. A cut corner structure has a change in direction of less than 90° angle, hence reducing the internal electric field at the device corners.

Figure 3:
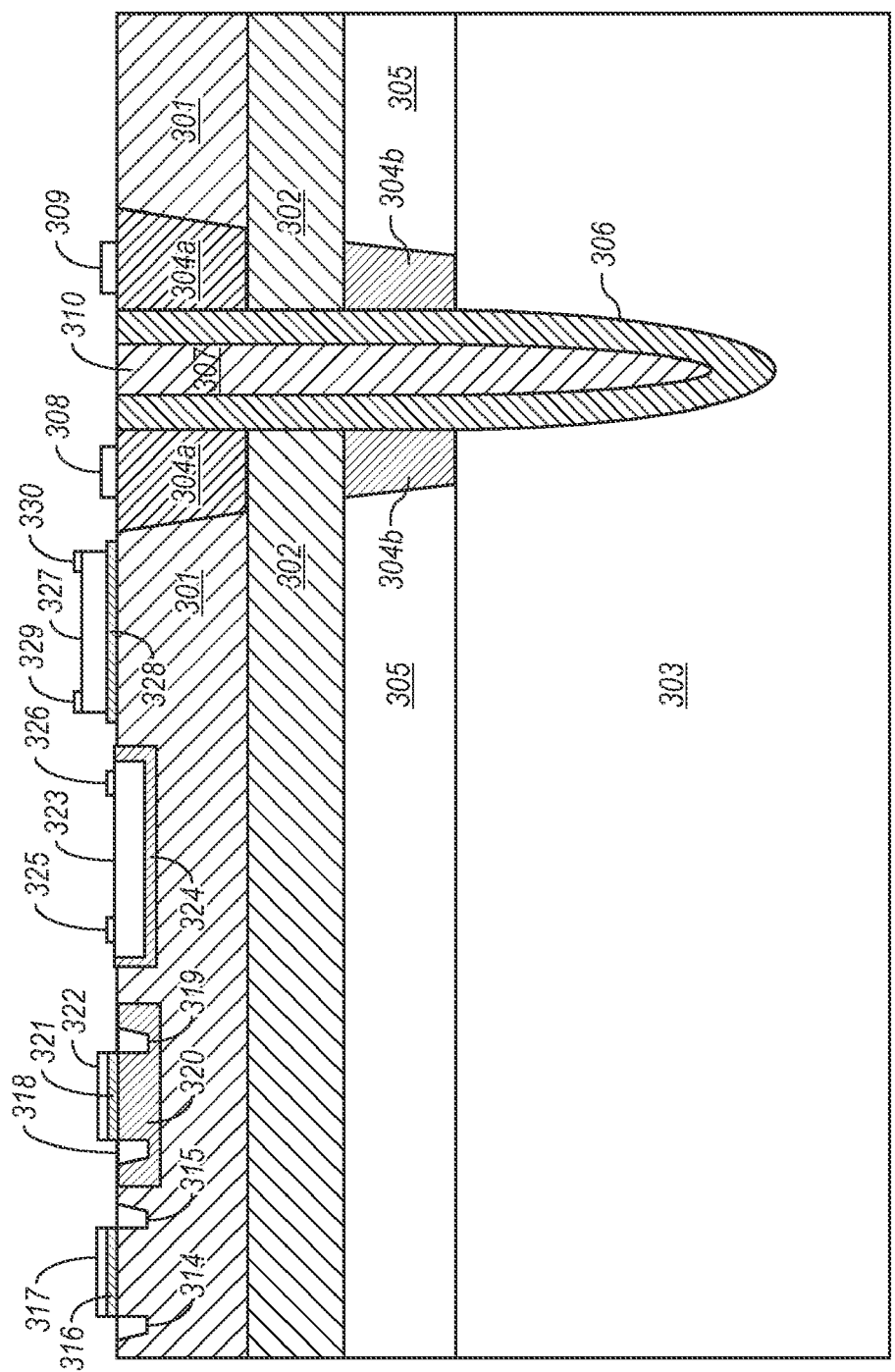
FIG. 3 shows a cross section views of a structure according to an embodiment.

FIG. 3 shows an embodiment of the present invention. A deep trench is etched in a semiconductor, e.g. silicon layer stack comprising a substrate (303) of a given conductivity type, a layer (305) of the same conductivity type but with a lower doping than (303), a layer (302) of the opposite conductivity type and finally a layer (301) of either conductivity type. The buried layer 302 isolates the layer 301 from the substrate 303. Active devices such as transistors, diodes, switches and/or passive device such as resistors, capacitors, inductors, may be formed into layer 301. The doping level of the buried layer 302 may be higher than that of the layer 301. Two examples of active devices that can be formed in layer (301) can be seen on FIG. 3. An active device can be a three-(or more)-terminal device such as a transistor. A first MOS transistor of the opposite conductivity type to that of layer 301 comprises a drain (314) and a source (315) e.g. diffused into layer 301, a gate 317 and a gate oxide (316). A second MOS transistor of the same conductivity type as that of the layer 301 can be integrated as well: a well 320 of a conductivity type opposite to that of layer 301 is formed, a drain (318) and a source (319) are then formed as well as a gate dielectric (321) and a gate electrode (322). The contacts to the drains 314 and 318 and to the sources 315 and 319 have not been drawn for the sake of clarity.

Two examples of passive components have also been drawn on FIG. 3. Passive devices are well known and include resistors, inductors and capacitors. A first resistor is formed (region 323) either directly in layer 301 or in a well 324 previously formed in layer 301. Region 323 is e.g. implanted, diffused, . . . . The resistor is contacted through contact 325 and 326. A second resistor 327 is formed on top of layer 301. Layer 301 and region 327 may or may not be isolated by a dielectric 328. The resistor is contacted through contact 329 and 330. Similarly, capacitors, diodes, inductances, . . . can be formed in layer 301 and/or above layer 301.

Doping concentration of layer (303) is typically in the $10^{18}$-$10^{19}$ cm$^{-3}$ range. Thickness and doping of layer (305) depends on the blocking voltage requirement but is typically around $10^{15}$-$10^{16}$ cm$^{-3}$ with thickness between 25 and 5 μm for blocking voltages between 250V and 10V. Layer (302) preferably has a very low sheet resistance, hence has a very high doping concentration, typically in the $10^{19}$ cm$^{-3}$ range. This can be achieved by ion implantation with doses in the low $10^{16}$ cm$^{-2}$ range. A typical concentration range for layer (301) is between $10^{15}$ and $10^{17}$ cm$^{-3}$ for devices with a blocking capability between 250V and 10V. The thickness of layer (301) is typically between 2 and 12 μm. The trench has an insulating layer (306) and is filled with a conductive material (307) for stress relief Layer (306) should be suitably thick in order to withstand a high field across it. For isolation structures in the 100-150V range, the oxide thickness is typically between 500 and 1000 nm. In addition, a highly doped region (304a) is formed at the top of the trenches to contact the layer (302). This second region (304a) can have a very low sheet resistance, by using a high doping concentration (range $10^{18}$-$10^{19}$ cm$^{-3}$). In this way, a self-aligned and area-effective way is found for contacting layer (302) at the top of the semiconductor, e.g. silicon. Second region (304a) has the same conductivity type as layer (302). In addition, a lightly doped layer (304b) is formed underneath layer (302) and into layer (305). First region (304b) has the same conductivity type as layer (302), but the opposite conductivity type of layer (305). Hence, a junction is formed in layer (305), adjacent to the trench sidewall (306). This extra junction will be depleted upon reverse biasing of the structure, thus supporting part of the voltage drop and relaxing the potential drop and crowding over the liner oxide. As a result, the reverse blocking voltage of the structure will be substantially increased. The concentration of region (304b) is in the $10^{16}$ cm$^{-3}$ range but needs to be optimized for a given breakdown voltage and layer (305) concentration. As an example for $V_{bd}$ in excess of 100V, the optimum concentration is $2.10^{16}$ cm$^{-3}$ when the concentration of layer (305) is $10^{15}$ cm$^{-3}$. See also FIG. 4d.

FIGS. 4a to 4d show graphs relating to an explanation of device operation according to an embodiment of the present invention.

Figure 4A:
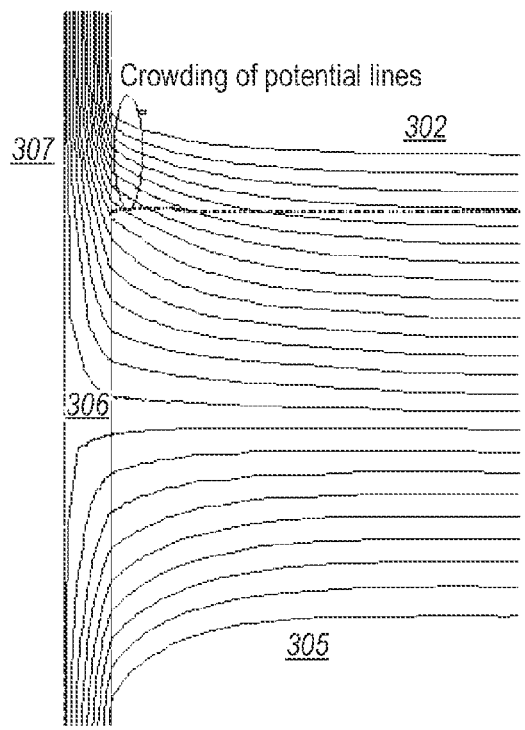
FIGS. 4a to 4d show graphs relating to an explanation of device operation according to an embodiment of the present invention.

FIG. 4a shows for reference the problems that can arise when a structure without region 304b is reverse biased. The trench inner poly 310 will be at a given potential, be it externally biased or be it floating. In the latter case, the potential of the inner polysilicon layer will be determined by the potential at the different contacts and of the substrate, as well as the part of the trench in each pocket i.e. its total capacitance. The voltage in the trench is then determined by a capacitive divider. In any case, if the polysilicon of the trench is suitably doped, it will act as an equipotential plane. Hence the potential lines in the semiconductor, e.g. silicon will be concentrated where they bend at the trench liner oxide near the interface between layers 302 and 305. This causes a substantial lowering of the reverse blocking voltage compared to the planar junction ((302)-(305)) breakdown. The electric field profile at breakdown along a cross-section parallel to the trench interface, is shown in FIG. 4c. A sharp peak is observed, leading to early breakdown.

Figure 4B:
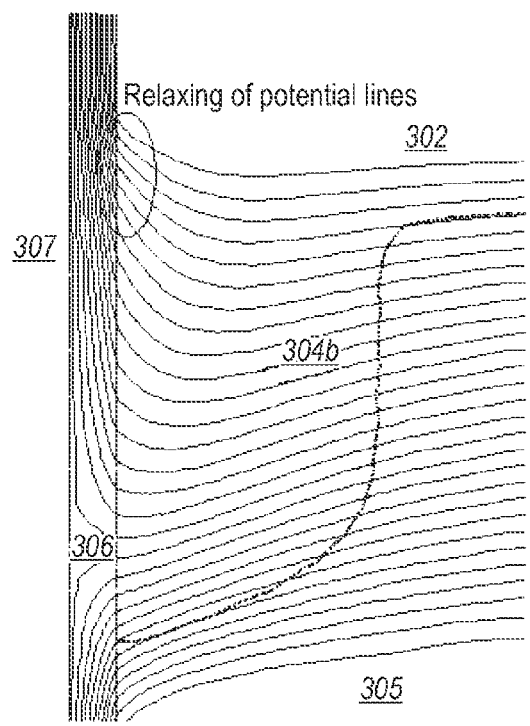
Figure 4C:
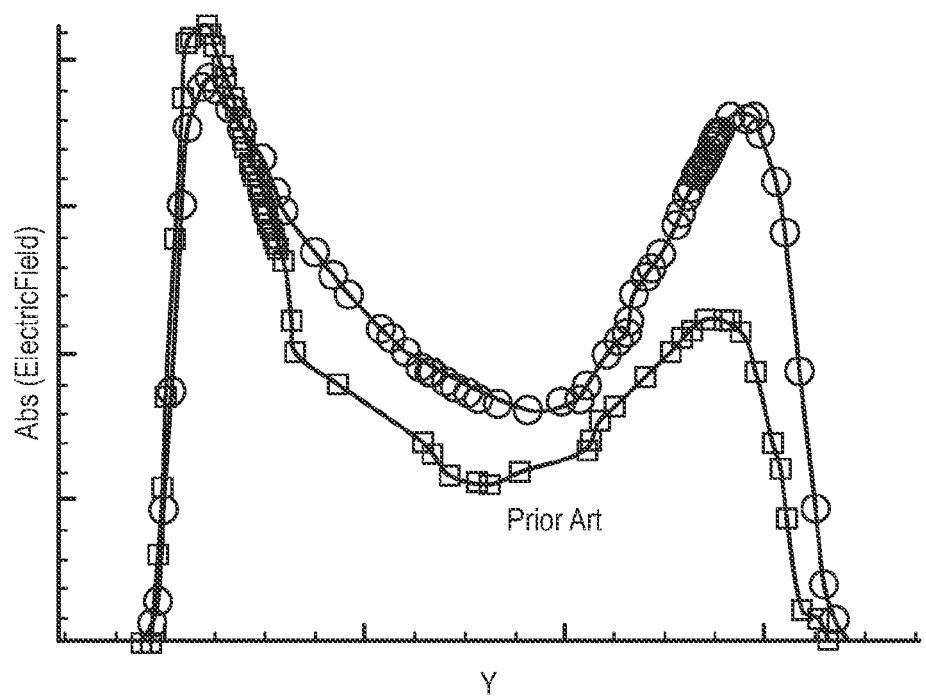
Figure 4D:
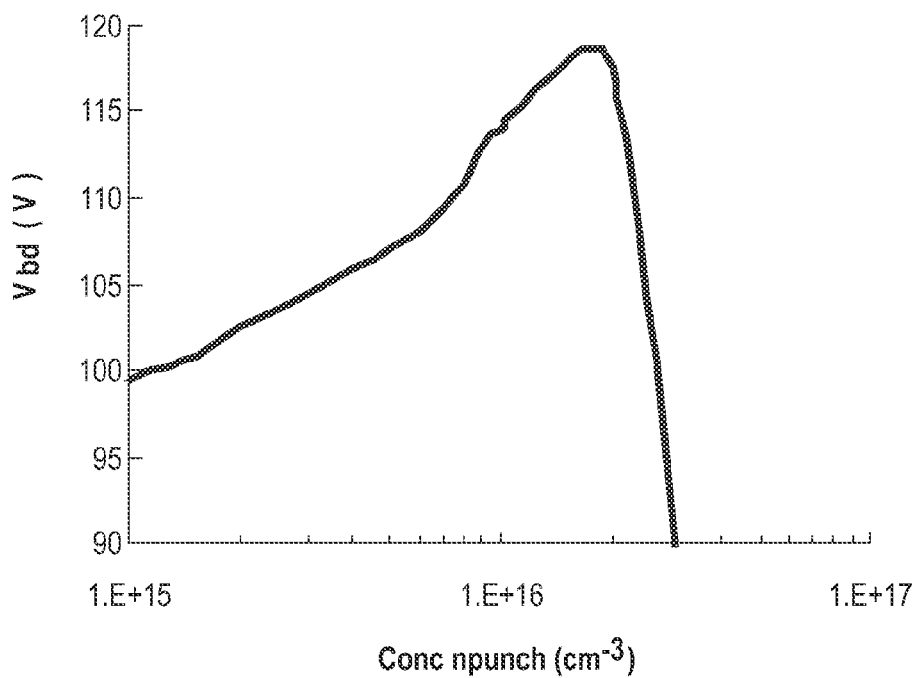

FIG. 4b shows the effect of implementing a suitably doped region (304b) adjacent to the trench and into layer (305), and of the opposite conductivity type, thus creating a p-n junction in layer (305). Due to the presence of this extra junction, the potential lines are smoothed, and are more relaxed, as is seen in FIG. 4b. FIG. 4c shows the electric field profile along a cross-section parallel to the trench interface, clearly revealing two distinct peaks (potential lines are less bent at the top, but more bent at the bottom of the structure). Thus the reverse blocking voltage (being the integral of the electric field profile) is increased compared to the reference example of FIG. 4a. FIG. 4d shows that the breakdown voltage is dependent on the doping of the first region (304b).

FIGS. 5a to 5f show steps in a method of manufacturing according to an embodiment of the present invention having the distinctive four layer structure and the distinctive first and second regions.

Figure 5A:
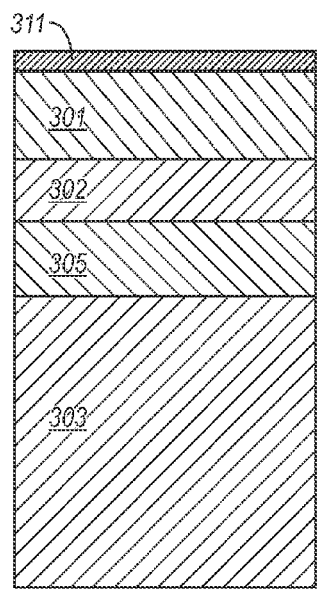
FIGS. 5a to 5f show steps in a method of manufacturing according to an embodiment of the present invention.

FIG. 5a: One starts with a semiconductor, e.g. silicon substrate of a given conductivity type (303), preferably but not necessarily with a high doping concentration (in excess of $10^{18}$ cm$^{-3}$). A layer of the same conductivity type (305) but with a lower concentration ($\sim 10^{15}$-$10^{16}$ cm$^{-3}$) is grown on top of the first layer. Then a highly doped layer of the opposite conductivity type (302) is made. This layer can be implanted and subsequently annealed, can be deposited and annealed, or can be grown in an epitaxial reactor. The doping concentration should be in excess of $10^{18}$ cm$^{-3}$. Then another layer (301) of either conductivity type but with a lower doping concentration, is grown. In an alternative embodiment of the present invention, all layers (305)-(302)-(301) are grown in an epitaxial-reactor, yielding the possibility to make a very low resistive layer (302) (rho sheet less than 5 Ω/square). Thus the implantation and annealing steps are skipped in the process flow. Moreover, such a low resistive layer cannot be made by implantation due to crystal defects. If layer (302) would be made by diffusion from a solid source, the diffusion tail will be large thus requiring the need to increase the thickness of layer (305) and the total trench depth. Then a hard mask (311) is deposited.

Figure 5B:
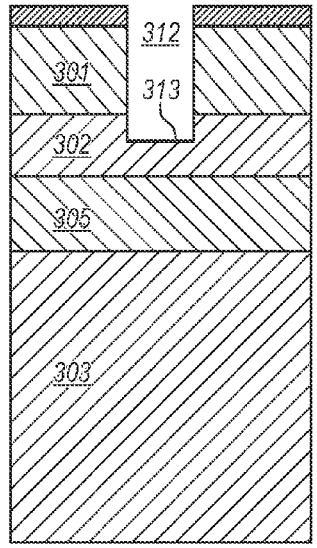
Figure 5C:
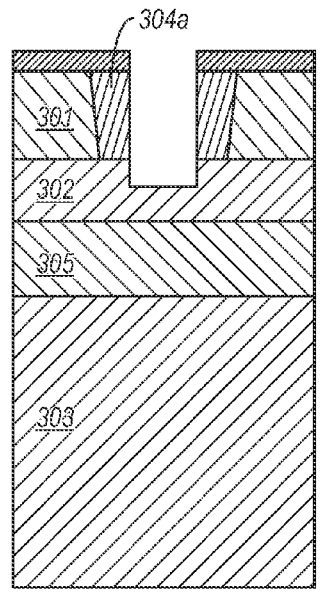

FIG. 5b, 5c: A first trench (312) is etched into semiconductor, e.g. silicon layers (301) and (302). A layer of a conductivity type to the same as layer (302) and with a high doping concentration, is deposited. During subsequent thermal annealing, the dopants are diffused into layers (301) and (302), establishing a second region (304a), yielding a low resistive connection of layer (302) to the top of the semiconductor, e.g. silicon layer. In an additional embodiment, the second region (304a) can also be formed by ion implantation.

Figure 5D:
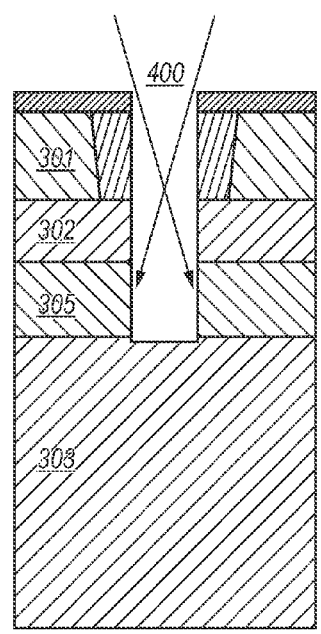
Figure 5E:
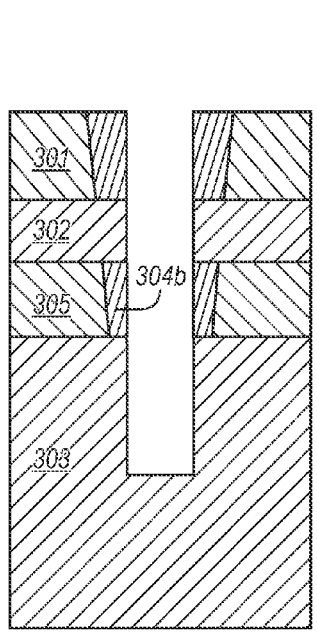

FIG. 5d, 5e: With the same hardmask (311), the trench (312) is etched deeper, into layer (305) and if necessary into layer (303). An ion implantation, indicated with arrows 400, with suitable angle and dose is performed, as to make the first region of the second conductivity type (304b). The doping of region (304b) can eventually also be carried out by diffusion from a suitably doped solid state source. The trench (312) can extend into layer (303), as the latter is highly doped and the small counterdoping of region (304b) is not expected to be significant. Then the hardmask (311) is removed.

Figure 5F:
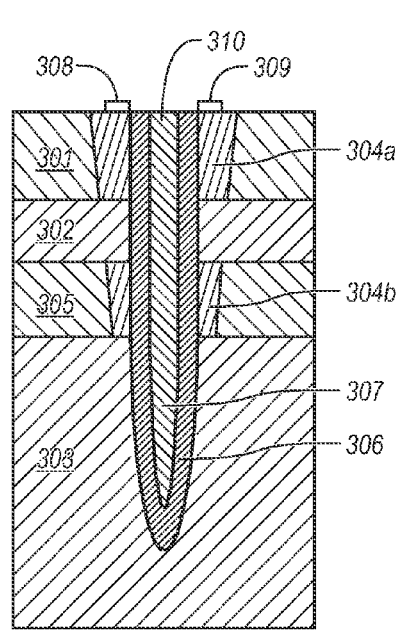

FIG. 5f: An isolating layer (306) is grown or deposited on the trench sidewall. The thickness of the insulating layer should be sufficient to withstand a high voltage. The trench can then be filled with a stress relief material such as amorphous Silicon for stress relief, or with an insulating material. Finally, the different pockets will be contacted (contacts (308), (309)), and if desired also the trench amorphous silicon layer can be contacted (310).

CONCLUDING REMARKS

Applications for such devices as have been described with reference to the present invention can include mixed analogue/digital ASIC's used in automotive, peripheral and consumer applications. The devices can use 0.35 μm based integrated device manufacturing technology, with device gate density of 500 kgates for example. The deep trench isolation for high voltage isolation means the isolation distance between the high voltage devices can be considerably reduced and hence reduce the total chip area drastically compared to technologies with a standard junction isolation scheme. A typical supply voltage for such devices is 36 V, for some applications a charge pump (additional 3.6 V) for external drivers can be used.

Applications can include any smart power products, especially high temperature products. In principle any type of technology can be used for the integrated circuit, examples include CMOS, bipolar or BiCMOS semiconductor devices. They can be formed in the semiconductor substrate such that the active devices are either circumscribed by the isolation trench, or a buried horizontal insulator layer can be used, so the active devices are completely surrounded by the isolation trench and the intersecting buried horizontal insulator layer.

Other applications, variations and additions can be envisaged within the scope of the claims.

What is claimed is:

1. An integrated semiconductor device having a first semiconductor layer of a first conductivity type, a second semiconductor layer of the first conductivity type over the first layer, a third semiconductor layer of a second conductivity type over the second layer and an isolation trench extending through the entire depth of the second and third layers into the first layer, wherein the isolation trench comprises an insulating layer next to the second and third layers, and wherein the insulating layer extends through the entire depth of the second and third layers; and wherein the integrated semiconductor device furthermore comprises a first region of the second conductivity type located next to the insulating layer of the isolation trench and extending from an interface between the second and third layers, towards the first semiconductor layer and along an interface between the second layer and the insulating layer of the isolation trench.

2. The device of claim 1, having a fourth semiconductor layer of either conductivity type, over the third semiconductor layer, and having one or more active devices in the fourth layer, the isolation trench extending through the fourth layer.

3. The device of claim 2, having a second region of the second conductivity type located next to the isolation trench and extending through the fourth layer, to contact the third semiconductor layer.

4. The device of claim 3, the second region not extending through the third semiconductor layer.

5. The device of claim 1, a sheet resistance of the third semiconductor layer being below 4 Ω/square.

6. The device of claim 2, the first, second, third and fourth semiconductor layers being in the form of a stack of silicon layers with p++/p−/n++/n− types respectively.

7. The device of claim 1, the first semiconductor layer having a higher doping level than that of the second layer.

8. The device of claim 1, the first semiconductor layer having the same doping level as the second semiconductor layer.

9. The device of claim 1, having a stopper at the bottom of the isolation trench.

10. The device of claim 1, having one or more corners in a path of the trench along a plane of the layers, the corners involving a change in direction of less than or equal to 90 degrees.

11. A method of manufacturing an integrated semiconductor device, having the steps of forming a first semiconductor layer of a first conductivity type, forming a second semiconductor layer of the first conductivity type over the first layer, forming a third semiconductor layer of a second conductivity type over the second layer, and forming an isolation trench extending through the entire depth of the second and third layers into the first layer, wherein the isolation trench comprises an insulating layer next to the second and third layers, and wherein the insulating layer extends through the entire depth of the second and third layers; and wherein the method furthermore comprises forming a first region of the second conductivity type next to the insulating layer of the isolation trench and extending from an interface between the second and third layers, towards the first layer and along an interface between the second layer and the insulating layer of the isolation trench.

12. The method of claim 11, having the steps of forming a fourth semiconductor layer of either conductivity type, over the third layer, before forming the isolation trench, the isolation trench being formed to extend through the fourth layer, and forming one or more active devices in the fourth layer.

13. The method of claim 11, having the step of forming a second region of the second conductivity type, self aligned to the isolation trench and extending through the fourth layer, to contact the third layer.

14. The method of claim 13, the step of forming the second region comprising implanting or diffusing a selected part of a sidewall of the trench before filling the trench.

15. The method of claim 11, the step of forming the first region comprising implanting or diffusing a selected part of a sidewall of the trench before filling the trench.

16. The method of claim 11, having the step of forming the third layer by an epitaxial process.

17. The method of claim 12, having the step of forming the first, second, third and fourth semiconductor layers as a stack of silicon layers using a single epitaxial process step.

18. The method of claim 12, the step of forming the isolation trench involving a step of forming a first trench through the fourth layer to the third layer, carrying out a process step, and subsequently deepening the trench through the third and second layers to the first layer.

19. The device of claim 1, the first region having a doping concentration lower than the doping concentration of the third semiconductor layer.

20. The device of claim 3, the first region having a doping concentration lower than the doping concentration of the second region.

21. The method of claim 11, wherein the step of forming first region includes forming the first region having a doping concentration lower than the doping concentration of the third semiconductor layer.

22. The method of claim 13, wherein the step of forming the first region includes forming the first region having a doping concentration lower than the doping concentration of the second region.

* * * * *